United States Patent [19]

Ward

[11] Patent Number: 5,563,119
[45] Date of Patent: Oct. 8, 1996

[54] STRIPPING COMPOSITIONS CONTAINING ALKANOLAMINE COMPOUNDS

[75] Inventor: Irl E. Ward, Bethlehem, Pa.

[73] Assignee: Ashland Inc., Dublin, Ohio

[21] Appl. No.: 378,489

[22] Filed: Jan. 26, 1995

[51] Int. Cl.[6] .............................. C11D 3/30; C11D 7/06; C11D 7/26; C11D 7/32
[52] U.S. Cl. ..................... 510/176; 510/201; 510/206; 510/212; 510/401; 510/402; 134/2; 134/38; 134/40; 430/329
[58] Field of Search .................... 252/156, 158, 252/171, 173, 548; 134/2, 38, 40; 430/329

[56] References Cited

U.S. PATENT DOCUMENTS

| | | | |
|---|---|---|---|
| 4,617,251 | 10/1986 | Sizensky | 430/256 |
| 4,744,834 | 5/1988 | Haq | 134/38 |
| 5,091,103 | 2/1992 | Dean et al. | 252/162 |
| 5,185,235 | 2/1993 | Sato et al. | 430/331 |
| 5,279,771 | 1/1994 | Lee | 252/548 |
| 5,334,332 | 8/1994 | Lee | 252/548 |
| 5,407,788 | 4/1995 | Fang | 430/318 |
| 5,417,877 | 5/1995 | Ward | 252/153 |

*Primary Examiner*—Paul Lieberman
*Assistant Examiner*—Gregory R. Delcotto
*Attorney, Agent, or Firm*—John Lezdey

[57] ABSTRACT

The invention teaches an aqueous stripping composition that is essentially free of any hydroxylamine compounds. The composition is an aqueous mixture of an alkanolamine, tetraalkylammonium hydroxide, and an inhibitor. The composition is particularly useful for cleaning substrates containing organic residues.

9 Claims, No Drawings

STRIPPING COMPOSITIONS CONTAINING ALKANOLAMINE COMPOUNDS

CROSS-REFERENCES TO RELATED APPLICATIONS

U.S. patent application Ser. No. 08/162,429 to Ward, which is incorporated herein, describes an aqueous stripping composition containing hydroxylamine and an alkanolamine. It was taught in that application that hydroxylamine was an essential ingredient of the composition (from about 15 to 22.5% by weight). The present invention in contrast, has eliminated the need for the hydroxylamine compound.

BACKGROUND OF THE INVENTION

1. Field of the Invention

This invention relates to an aqueous stripping composition that is particularly useful for cleaning organic and inorganic compounds or polymers from a substrate. More particularly, the invention describes an aqueous stripping composition having an alkanolamine and tetraalkylammonium hydroxide. Preferably, the invention further includes a metal corrosion inhibitor, and the composition is essentially free of any hydroxylamine compounds.

2. Description of the Prior Art

An industrial process that produces an article of manufacture often repetitively uses one or more elements of the process for economic and reproduciability reasons. In particular, it is quite common for articles to be manufactured on a substrate and then subsequently removed from said substrate. In such a situation, it would be advantageous to be able to reuse the substrate for the manufacture of the next article.

The substrate, however, is often contaminated from the process and needs to be efficiently cleaned without impairing its integrity. Accordingly, there exists a need to develop an improved stripping composition to efficiently clean a variety of substrates from the deposits of a wide variety of compositions. This composition should also be economical, environmental friendly and easy to use.

The present invention teaches such a new and improved stripping composition. This composition is aqueous, dissolves both organic and inorganic substances, and cleans a variety of substrates, thus allowing for the reuse of the substrate for another process.

During manufacture of semiconductors and semiconductor microcircuits, it is frequently necessary to coat the substrates from which the semiconductors and microcircuits are manufactured with a polymeric organic filing, generally referred to as a photoresist, e.g., a substance which forms an etch resist upon exposure to light. These photoresists are used to protect selected areas of the surface of the substrate, while the etchant selectively attacks the unprotected area of the substrate. The substrate is a typically silicon dioxide coated silicon wafer and may also contain metallic microcircuitry, such as aluminum or aluminum alloys on the surface. Following completion of the etching operation and washing away of the residual etchant, it is necessary that the resist be removed from the protective surface to permit essential finishing operations. It is desirable to develop an improved stripping composition to remove the organic polymeric substance from a coated inorganic substrate without corroding, dissolving or dulling the metal circuitry or chemically altering the wafer substrate.

Stripping compositions used for removing coatings from photoresists and other substrates have for the most part been highly flammable, generally hazardous to both humans and the environment, and comprise reactive solvent mixtures exhibiting an undesirable degree of toxicity. Moreover, these stripping compositions are not only toxic, but their disposal is costly since they must be disposed of as a hazardous waste. In addition, these compositions generally have severely limited bath life and, for the most part, are not recyclable or reusable.

Generally, compositions containing chlorinated hydrocarbons and/or phenolic compounds or other highly caustic and corrosive materials have been employed as stripping compositions for stripping paints, varnishes, lacquers, enamels, photoresists, powder coatings and the like, from substrates such as wood, metal or silicon wafers. Hot caustic compositions are generally employed to remove coatings from metals and methylene chloride compositions to remove coatings from wood. In many cases, the components of the stripping compositions are relatively toxic reactive solvent mixtures and thus must be subject to stringent use conditions and require hazardous chemical handling procedures and wearing of safety garments and apparel by users so as to avoid contact with the stripping compositions. Additionally, because many of the toxic components of such stripping compositions are highly volatile and subject to high evaporation rates, they require special human and environmental safety precautions to be taken during storage and use of said compositions.

U.S. Pat. No. 4,276,186 to Bakos et al discloses a non-aqueous cleaning composition which includes N-methyl-2-pyrrolidone and an alkanolamine. However, in a comparative study, applicant has found that the use of N-methyl-2-pyrrolidone does not provide a broad spectrum of cleaning as is capable with the composition of the present invention.

U.S. Pat. No. 4,617,251 to Sizensky discloses a non-aqueous stripping composition which is prepared with a select amine and an organic polar solvent. The composition is formed utilizing from about 2 to about 98% by weight of an amine compound and about 98 to about 2% of an organic polar solvent.

U.S. Pat. No. 4,770,713 to Ward discloses a stripping composition comprising an alkylamide and the alkanolamines which are useful in the present invention.

U.S. patent application Ser. No. 08/162,429 to Ward discloses a non-aqueous stripping composition comprising hydroxylamine, an alkanolamine and water. U.S. Pat. No. 5,279,771 to Lee describes a non-aqueous stripping composition containing hydroxylamine, an alkanolamine and an organic polar solvent. Another Lee reference, U.S. Pat. No. 5,334,332 describes a cleaning solution for resist-free substrates that contains hydroxylamine, an alkanolamine and water. None of these references disclose a hydroxylamine-free composition. Nor do these references suggest, alone or in combination with other prior art, eliminating hydroxylamine from a suitable stripping composition.

The present invention, in contrast, provides an effective stripping composition that comprises an aqueous solution of an alkanolamine a corrosion inhibitor and a tetraalkylammonium hydroxide, wherein the said composition is essentially free of any hydroxylamine compounds. In a copending patent application to Ward, filed herewith, Ward describes an aqueous stripping composition essentially comprising monoethanolamine. The use of a tetraalkylammonium hydroxide in the present application allows for the use of a wider range of chemicals in a wider range of proportions. In particular, the present invention may contain one or more alkanolamines, rather than just monoethanolamine. Moreover, the tetraalklkyl ammononium hydroxide compound works synergistically with the inhibitor to provide superior anti-corrosive properties.

Recently, OSHA, EPA and other similar federal, state and local governmental regulatory agencies have advocated a shift toward using more human and environmentally compatible stripping compositions and stripping methods that are not subject to the aforementioned drawbacks and problems.

Moreover, heretofore available photoresist stripping compositions have required unduly long residence times or repeated applications in order to remove certain coatings. In addition, various coatings have resisted removal from certain substrates with these conventional stripping compositions. That is, the previously available stripping compositions have not provided adequate or complete removal of certain hard-to-remove coatings from various substrates.

It is, therefore, highly desirable to provide stripping compositions that exhibit substantially little human or environmental toxicity, are water miscible and are biodegradable. It is also desirable to provide stripping compositions that are substantially non-flammable, non-corrosive, evidence relatively little, if any, tendency to evaporate, and are generally unreactive and of little toxicity to humans as well as being environmentally compatible.

In addition, it would be desirable to provide photoresist stripping compositions that have a high degree of stripping efficacy, particularly at lower temperatures than generally required with prior stripping compositions.

It is also highly desirable that photoresist stripping compositions be provided that exhibit substantially no corrosive effects on the substrate.

It is also desirable that effective stripping compositions be provided that are devoid of objectionable chlorinated or phenol components and do not require the use of hot caustic components. Most desirable are stripping compositions and use thereof that are not considered undesirable by regulatory agencies overseeing their production and use.

It is also most advantageous that stripping compositions be provided with the above-identified desirable characteristics which evidence synergistic stripping action in that the mixtures of components provide stripping efficacy and stripping results not always obtainable with the individual components.

U.S. Pat. No. 3,972,839 to Murphy discloses a composition useful for stripping paint films comprising one or more alkaline materials and an accelerator. The accelerator comprises a mixture of two different amine compounds. Of significance in Murphy is the disclosure that various alkanolamines, in and of themselves, were ineffective in stripping capabilities. See U.S. Pat. No. 3,972,839 at Table I, col. 4 (e.g., monoethanolamine had no stripping effect after 30 minutes). This is why it is surprising that an alkanolamine in combination with tetraalkylammonium hydroxide is such an effective stripping composition in the present invention.

SUMMARY OF THE INVENTION

The present invention teaches a stripping composition in which the hereinbefore mentioned disadvantages or drawbacks are eliminated or substantially reduced and in which the range of usefulness of the stripping compositions is greatly extended.

The novel stripping compositions of the present invention consisting essentially of an aqueous solution of an alkanolamine, an inhibitor and a tetraalkylammonium hydroxide. Advantageously, the tetraalkylammonium hydroxide which is utilized is hydrated.

Preferably, the stripping composition consists essentially of about 56 to 91% by weight of an alkanolamine, up to 10% by weight of an inhibitor, 6 to 2% by weight of a tetraalkylammonium hydroxide and the balance of the composition being water.

Preferably, the inhibitor is one which forms a 5- or 6-membered ring coordination complex with the substrate.

It is advantageous that the stripping composition of the invention be free of other types of amines so as to avoid corrosion of the photoresist substrate and reduction of stripping efficiency.

The novel stripping compositions of the invention exhibit synergistically enhanced stripping action and stripping capabilities at low temperatures that are not possible from the use of the individual components or the components in combination with other stripping components such as ethoxyethanolamine or alkylamides.

It is a general object of the invention to provide a stripping composition that is effective at low temperatures.

It is another object of the invention to provide a photoresist stripping composition that is non-corrosive.

It is a further object of the invention to provide a photoresist stripping composition that inhibits redeposition of metal ions.

It is yet another object of the invention to provide a method for stripping a coated substrate that can be accomplished at low temperatures and which does not cause redeposition of metal ions.

It is also a further object of this invention to provide a method for removing polymeric organic substances from the surfaces of aluminized inorganic substrates, particularly aluminized silicon dioxide, with water, an amine, a tetraalkylammonium hydroxide but no hydroxylamine compounds, without causing etching of the substrate or corrosion and dulling of the metallic circuitry on the surface of the inorganic substrate.

DETAILED DESCRIPTION OF THE PREFERRED EMBODIMENTS

The stripping compositions of the invention comprise an aqueous mixture of an alkanolamine a corrosion inhibitor and a tetraalkylammonium hydroxide. The alkanolamine compound is advantageously about 56 to 91% by weight, the hydroxide is about 6 to 2% by weight, and the water is about 5 to 34% by weight.

Corrosion inhibitors in an amount of up to about 10% by weight are added to the stripping compositions. Preferably, the inhibitor concentration is about 8 to 2% by weight, and most preferably, about 5% by weight. Suitable inhibitors are disclosed in copending application Ser. No. 07/983,257 to Ward filed Nov. 30, 1992, which is herein incorporated by reference. The stripping composition of claim 5 wherein the inhibitor is a compound selected from the group consisting of:

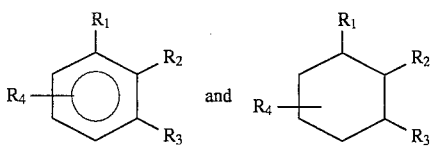

wherein $R_1$, $R_2$, $R_3$ and $R_4$ are the same or different and each represent H, OH, $NHR_4$, $CO_2R_6$, $COR_7$ and SH, wherein $R_5$ and $R_6$ are the same or different and each represent H or lower alkyl, and $R_6$ represents lower alkyl, with the proviso that when $R_4$ is H, not more than one of $R_1$, $R_2$ and $R_3$ is the same as $R_4$, and when $R_3$ is not H, not more than one of $R_1$, $R_2$ and $R_4$ is hydrogen, the remainder being the same or different than $R_3$. Preferred inhibitors include catechol, pyrogallol, anthranilic acid, gallic acid, gallic esters, and the like.

The alkanolamines which are useful in the compositions of the invention are the lower alkanol amines which include monoethanolamine, diethanolamine, mono-, di- and tri-isopropanolamine, and the like. Preferred is monoethanolamine alone or in combination with other alkanolamines.

The tetraalkylammonium hydroxide compounds which are useful in the invention are tetramethylammonium hydroxide (TMAH), tetraethyl ammonium hydroxide, diethyl dimethyl ammonium hydroxide, and the like. Advantageously, the hydrates of the hydroxide compounds are utilized. The most preferred hydroxide compound is $TMAH.5H_2O$.

The preferred stripping composition consists essentially of about 73% by weight of monoethanolamine, about 18% by weight of water, about 5% by weight of inhibitor and about 4% by weight of $TMAH.5H_2O$.

The stripping compositions of this invention are especially useful and advantageous for numerous reasons among which may be mentioned the following. The stripping compositions are water soluble, non-corrosive, non-flammable and of low toxicity to the environment. The stripping compositions evidence high stripping efficiency at low temperatures for a wide variety of coatings and substrates. The stripping compositions are particularly suitable for removal of photoresists and residues from plasma processing used in integrated circuit fabrication since they also prevent the redeposition of metal ions, especially sodium and potassium ions.

The stripping compositions are easily prepared by simply mixing an alkanolamine, a tetraalkylammonium hydroxide and water at room temperature. An inhibitor can then be added.

The process of the invention is carried out by contacting a substrate containing an organic or metal-organic polymer, inorganic salt, oxide, hydroxide or complex or combination thereof as a film or residue, (e.g. sidewall polymer (SWP)), with the described stripping composition. The actual conditions, e.g., temperature, time, etc., depend on the nature and thickness of the complex (photoresist and/or SWP) material to be removed, as well as other factors familiar to those skilled in the art. In general, for photoresist stripping, the photoresist is contacted or dipped into a vessel containing the stripping composition at an elevated temperature, preferably between 40°–80° C. for a period of about 5–25 minutes and then washed with water. It is advantageous to maintain the concentration of the alkanolamine in the stripping bath within the range of 56 to 91% by weight.

Representative organic polymeric materials include positive photoresists, electron beam resists, X-ray resists, ion beam resists, and the like. Specific examples of organic polymeric materials include positive resists containing phenolformaldehyde resins or poly (p-vinylphenol), polymethylmethacrylate-containing resists, and the like. Examples of plasma processing residues side wall polymers (SWP) include among others, metal-organic complexes and/or inorganic salts, oxides, hydroxides or complexes which form films or residues either alone or in combination with the organic polymer resins of a photoresist. The organic materials and/or SWP can be removed from conventional substrates known to those skilled in the art, such as silicon, silicon dioxide, aluminum, aluminum alloys, copper, copper alloys, etc.

The form of the invention shown and described herein and the examples that follow represents an illustrative preferred embodiment and variations thereof. It is understood that various changes may be made without departing from the gist of the invention as defined in the claims.

EXAMPLE 1

A vessel is charged at ambient temperature with 73% by weight monoethanolamine and 18% by weight water. With agitation 4% of tetramethyl ammonium hydroxide hydrated with five (5) parts of water and 5% of catechol, as an inhibitor are added. The solution is ready for use within a couple of minutes depending upon how much agitation is provided.

EXAMPLE 2

A corrosion test with water was performed for various compositions with VIA contact hole processing at the metal 1 step using as a substrate an Al/Cu (2%) metal alloy sputter deposited on top of a silicon substrate. Attack was assessed by a change in color of the composition after 60 minutes to blue (moderate attack) or yellow-green (severe attack) indicating formation of a stable complex of oxidized (corroded) copper alloy. Further direct optical microscopic observation was used to determine metal surface pitting.

| Composition | Wt % | | | | | |
|---|---|---|---|---|---|---|
| | 1 | 2 | 3 | 4 | 5 | 6 |
| Triethanol amine | 0 | 35 | 0 | 39 | 0 | 35 |
| Monoethanol-amine | 73 | 38 | 78 | 38 | 73 | 38 |
| Tetramethyl ammonium hydroxide | 4 | 4 | 4 | 4 | 0 | 0 |
| Water | 18 | 18 | 18 | 18 | 22 | 22 |
| Catechol | 5 | 5 | 0 | 0 | 5 | 5 |
| Color | clear (no pitting) | clear (no pitting) | yellow-green (pitting) | green (pitting) | clear | blue |

The tests illustrate that tetramethyl ammonium hydroxide requires the presence of an inhibitor to prevent pitting or corrosion.

We claim:

1. An aqueous stripping composition for photoresists free of any hydroxylamine compounds, consisting essentially of a mixture about 56 to 91% by weight of an alkanolamine, about 6 to 2% by weight of a tetraalkylammonium hydroxide, about 8 to 2% by weight of a corrosion inhibitor which is a compound selected from the group consisting of catechol, pyrogallol, anthranilic acid, gallic acid and gallic ester and the balance being water.

2. The stripping composition of claim 1 wherein said tetramethylammonium hydroxide is tetraalkylammonium hydroxide hydrated with five parts of water.

3. A stripping composition of claim 1 wherein the inhibitor forms a coordination complex with the photoresist substrate.

4. The stripping composition of claim 2 wherein said alkanolamine is monoethanolamine.

5. The stripping composition of claim 6 wherein the aqueous portion is 30 to 5% by weight.

6. The stripping composition of claim 5 wherein the monoethanolamine is 73% by weight, the hydrated tetramethylammonium hydroxide is 4% by weight, the inhibitor is 5% by weight and the aqueous portion is 18% by weight.

7. A process of removing an organic residue from an inorganic substrate comprising contacting the organic residue with an effective amount of the stripping composition of claim 1 for an effective period of time and removing the residue from the substrate.

8. A process of removing an organic residue from an inorganic substrate comprising contacting the organic residue with an effective amount of the stripping composition of claim 2 for an effective period of time and removing the residue from the substrate.

9. A process of removing an organic residue from an inorganic substrate comprising contacting the organic residue with an effective amount of the stripping composition of claim 6 for an effective period of time and removing the residue from the substrate.

* * * * *